United States Patent [19]
Sato et al.

[11] Patent Number: 5,557,508
[45] Date of Patent: Sep. 17, 1996

[54] HIGH-DENSITY CIRCUIT MODULE AND METHOD OF PRODUCING THE SAME

[75] Inventors: Teruhiro Sato; Tomio Wada; Yoshiyuki Hirayama, all of Yokohama, Japan

[73] Assignee: Matsushita Electric Industrial Co., Ltd., Osaka, Japan

[21] Appl. No.: 160,186

[22] Filed: Dec. 2, 1993

[30]     Foreign Application Priority Data

Jun. 10, 1992   [JP]   Japan ..................................... 4-150342

[51] Int. Cl.⁶ .................................................. H05K 9/00
[52] U.S. Cl. .......................... 361/818; 361/753; 174/52.4; 174/35 R; 29/831
[58] Field of Search ................................ 29/831; 361/816, 361/818, 753; 174/52.5, 35 R, 52.4

[56]             References Cited

U.S. PATENT DOCUMENTS

| | | | |
|---|---|---|---|
| 5,159,537 | 10/1992 | Okano .................................. | 174/35 R |
| 5,162,971 | 11/1992 | Sato et al. . | |
| 5,365,410 | 11/1994 | Lonka .................................... | 174/35 R |

FOREIGN PATENT DOCUMENTS

| | | | |
|---|---|---|---|
| 64-24496A | 1/1989 | Japan . | |
| 1-81399 | 3/1989 | Japan .................................. | 361/818 |
| 1-89397 | 4/1989 | Japan .................................. | 174/35 R |
| 1-289298 | 11/1989 | Japan .................................. | 174/35 R |
| 3-104199 | 5/1991 | Japan .................................. | 174/35 R |
| 4150097 | 5/1992 | Japan .................................. | 361/816 |
| 5-90778 | 4/1993 | Japan .................................. | 361/816 |
| 5259685 | 10/1993 | Japan .................................. | 361/816 |

*Primary Examiner*—P. W. Echols
*Attorney, Agent, or Firm*—Watson Cole Stevens Davis, P.L.L.C.

[57]             ABSTRACT

Single flat metal sheet blank in which thin metallic parts including side frames which are to form side walls, a shield plate and external lead and the like are connected together in a developed state in positional relationships necessary for the assembly of the high-density circuit module. A circuit board is then placed on one side of the shield plate of the flat metal sheet blank. Terminals having pedestals are formed on the shield plate. The terminals are inserted into holes formed in the circuit board and connected to conductors on the circuit board. Then, operations such as severance or bending are effected on selected connecting portions at which the thin metallic parts arranged in developed state are inter-connected, and required processings are executed on the portions to be jointed, whereby the circuit module is completed. According to this production method, a space for receiving circuit components is formed between the circuit board and the shield plate, so that both sides of the circuit board can be used for mounting the circuit components, whereby a high packaging density is attained.

8 Claims, 4 Drawing Sheets

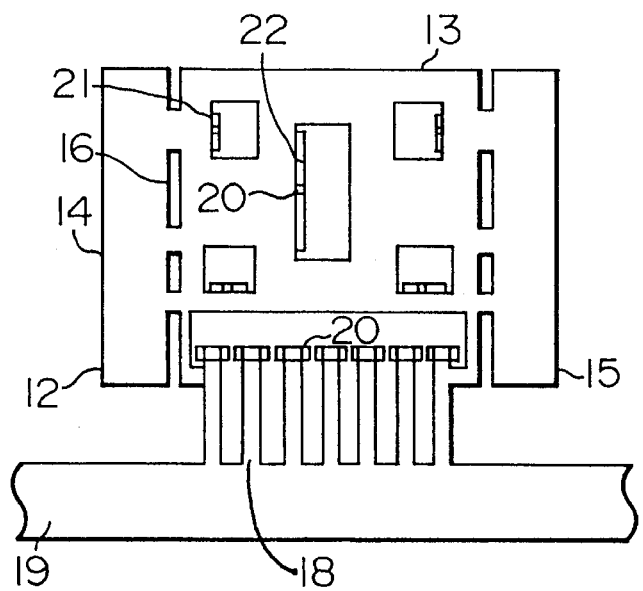 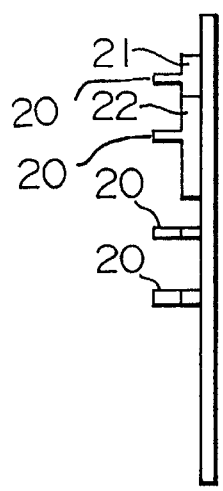 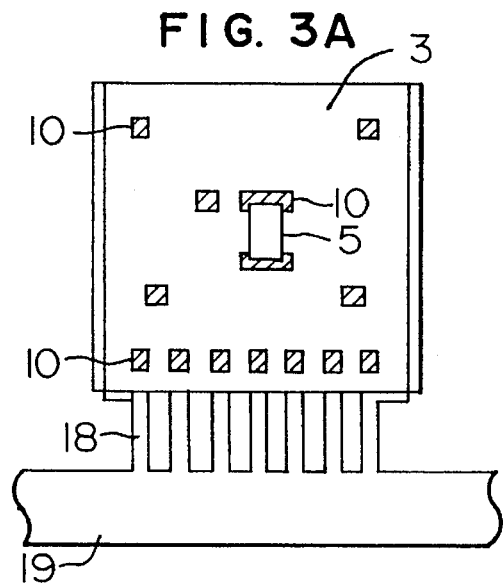 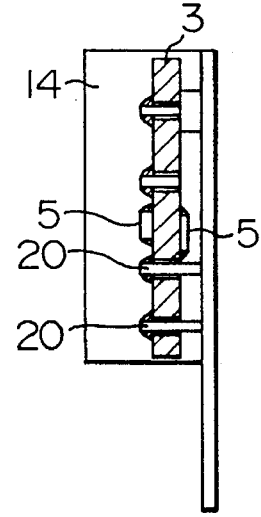 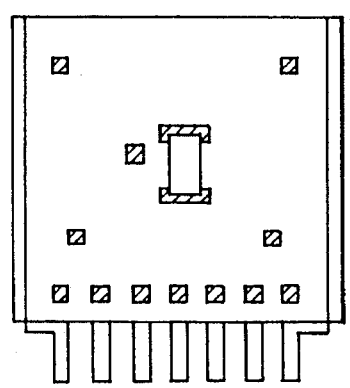 

HIGH-DENSITY CIRCUIT MODULE AND METHOD OF PRODUCING THE SAME

BACKGROUND OF THE INVENTION

1. Field of the Invention

The present invention relates to a high-density circuit module and a method of producing the same, and more particularly, to a high-density circuit module which unites preselected circuits of an electronic device, and also to a method of producing such a high-density circuit module.

2. Description of the Related Art

The inventors of the present application have already proposed a circuit module having thin metal sheet parts such as external lead, shield plate, side frame and shield case. This circuit module is produced by a process which includes the steps of forming the metallic blanks in a developed state, connecting these metallic blanks together in a positional relationship necessary for the assembly, so as to form a single planar developed metallic assembly, placing a printed board on the developed metallic assembly, mounting circuit components on the circuit board and achieving necessary electrical connections, and effecting severance, bending and processing of the connecting portions, This known circuit module is disclosed in, for example, Japanese Patent Unexamined Publication No. 2-73693 which corresponds to U.S. Pat. No. 5,162,971. Referring to FIG. 5 which shows this known circuit module, a shield case 1 and a shield plate 2, which are respectively made of thin sheets of metals such as iron or copper, are jointed together by caulking, fitting or soldering. An external lead 4 has one end received in a hole 9 formed in a circuit board 3 and is connected to a conductor 10 on the circuit board 3 by soldering as at 6. Circuit components 5, 5 mounted on the circuit board 3 have terminals 7 which are connected to conductors 10 on the circuit board 3 by soldering as at 6.

FIGS. 6A and 6B show the process of producing the circuit module shown in FIG. 5. Referring to FIG. 6A, an elongated thin metal sheet 12 has vacant portions partially formed by press work, etching or the like. The thin metal sheet has a main portion 13 which is to form the shield plate 2 in the product, and side frames 14, 15 connected to both sides of the main portion 13, thereby forming slits 16 between there and the portions of the side frames 14, 15. Numeral 18 designates lead portions which are to form the external leads 4 of the product. The lead portions 18 are protruded from a common stem portion 19 so as to connect the lead portions 18 located at both end sides thereof to the above-mentioned main portion 13. Free ends 20 of the lead portions 18 are bent substantially at a right angle. Then, the circuit board 3 is placed on the main portion 13 of the metal sheet 12 as shown in FIG. 7A. In this state, the free ends 20 of the lead portions 18 are inserted into holes 9 formed in the circuit board 3. Then, the connection between the circuit components 5 and the conductors 10 on the circuit board 3, as well as the connection between the lead portions 18 and the conductors 10 on the circuit board 3, is achieved by soldering. The soldering may be conducted by applying a solder paste to all the portions which are to be soldered, and heating and melting the solder paste by, for example, re-flow heating, so that all portions to be connected are soldered at a time. After completion of the soldering, the side wall portions 14, 15 are bent out of the plane of the main part 13. The bending is facilitated by the provision of the slits 16. Subsequently, as shown in FIGS. 8A and 8B, the lead portions 18 are severed from the common portion 19, and the whole structure is covered by the shield case 1, whereby the circuit module as shown in FIG. 5 is obtained.

Achievement of higher packaging density in this type of circuit module poses various requirements to be met. Firstly, it is necessary to reduce the sizes of the circuit components so as to correspondingly reduce the areas of installation of these components. Secondly, the wiring pattern on the circuit board has to be made finer so as to secure the wiring capacity. It is also necessary to mount the circuit components with reduced spacing distances from one another so as to reduce a dead space therein. For these reasons, the prices of the circuit components and the circuit board are raised. Furthermore, the yield of the soldering is reduced due to standing of the chip components during re-flowing of the solder or due to facilitating of generation of solder bridge. Furthermore, since further precise mounting is needed, there is a problem that the number of steps of the mounting process is increased due to the use of a specific mounting device capable of precisely locating and mounting the circuit components. It is also to be pointed out that deterioration in the performance and lack of stability of operation are likely to be caused due to interference between adjacent circuits because of the reduced spacing between these circuit parts. Such deterioration in the performance and unstable operation would be overcome when the circuit module incorporates anti-interference elements such as filters, an internal shield and so forth. Such a solution, however, poses another problem: namely, increase in the material costs and production costs due to increase in the number of parts and the number of steps in the assembly process.

SUMMARY OF THE INVENTION

Accordingly, an object of the present invention is to provide a high-density circuit module in which the packaging density is enhanced without requiring the sizes of the circuit components to be reduced and in which interference between adjacent circuits is avoided, thereby overcoming the above-described problem.

To this end, according to one aspect of the present invention, there is provided a method of producing a high-density circuit module, comprising the steps of: preparing a single flat metal sheet blank in which thin metallic parts including a shield case, side frames which are to form side walls, a shield plate and external leads and the like are connected together in a developed state in positional relationships necessary for the assembly; placing a circuit board on one side of the shield plate of the flat metal sheet blank; forming holes in the circuit board; inserting terminals formed on the shield plate into the holes formed in the circuit board; and conducting operations including severance and bending on selected connecting portions where the thin metallic parts arranged in developed state are connected, and effecting required processing on the portions to be jointed.

The present invention in another aspect provides a high-density circuit module produced by the method stated above.

In the circuit module of the present invention having the described features, a space is formed between the shield plate and the circuit board, by virtue of the provision of the pedestals or internal shields on the terminals. This space allows circuit components to be mounted not only on the upper side but also on the lower side of the circuit board, thus attaining a higher packaging density. In addition, the internal shields formed on the lower shield plate are directly connected to a grounding line on the circuit board, so that the shielding effect is enhanced to improve and stabilize the performance of the circuit module.

BRIEF DESCRIPTION OF THE DRAWINGS

FIG. 2A is a plan view of a thin metallic sheet blank employed in the process for producing the circuit module shown in FIG. 1;

FIG. 2B is a side elevational view of the thin metallic sheet blank shown in FIG. 2A;

FIG. 3A is a plan view of the thin metallic sheet blank of FIG. 2A, in a step of mounting a circuit board thereon, in the process of producing the circuit module;

FIG. 3B is a side elevational section of the metallic sheet blank in the step shown in FIG. 3A;

FIG. 4A is a plan view of the circuit module in a production step in which lead portions are severed from the thin metallic sheet blank shown in FIG. 3A and a shield case is attached thereto;

FIG. 4B is a side elevational view of the circuit module in the step of the production process shown in FIG. 4A;

DESCRIPTION OF THE PREFERRED EMBODIMENTS

Figure 1:
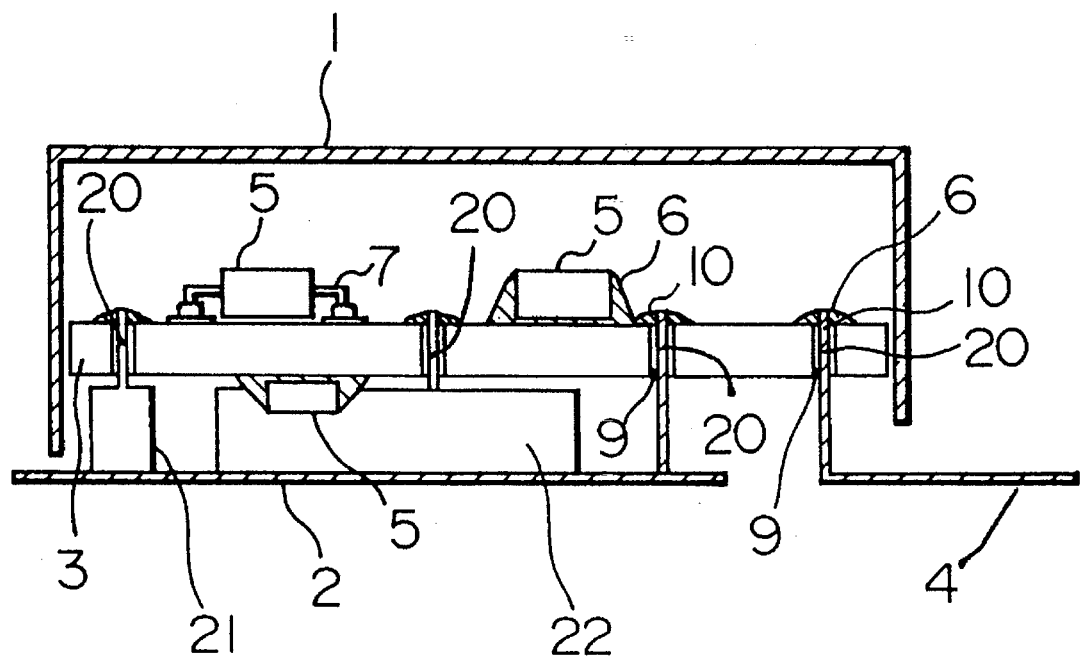
FIG. 1 is a sectional view of an embodiment of the circuit module in accordance with the present invention.
Figure 5:
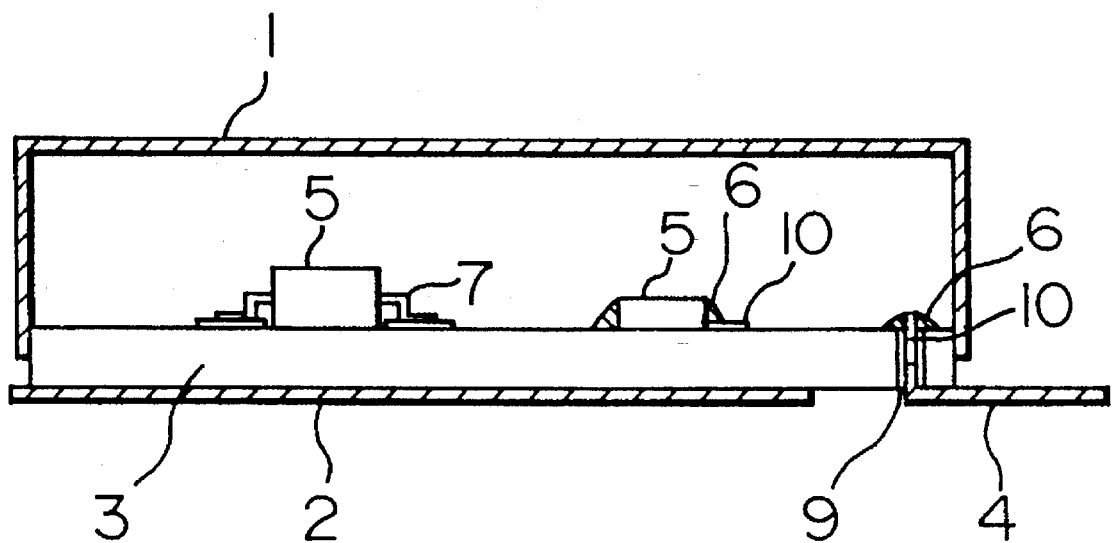
FIG. 5 is a sectional view of a conventional circuit module.
Figure 6A:
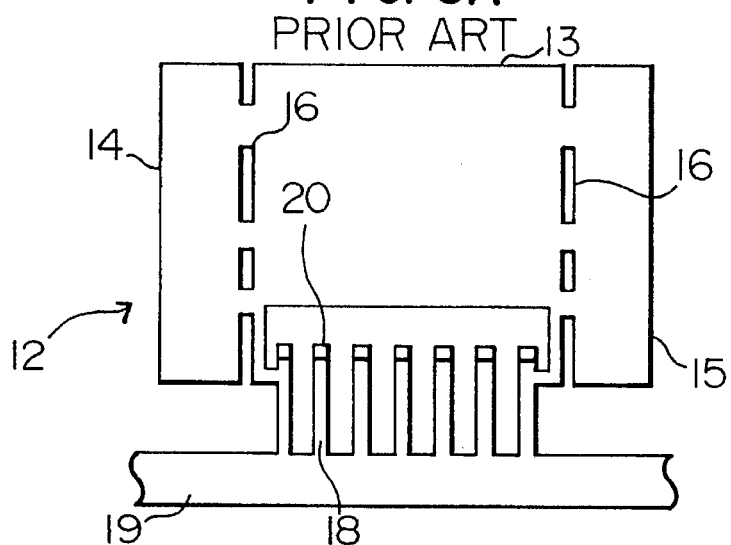
FIG. 6A is a plan view of a thin metallic sheet blank employed in the production of the conventional circuit module shown in FIG. 5.
Figure 6B:
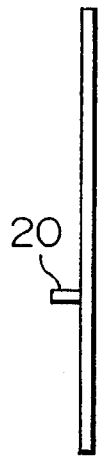
FIG. 6B is a side elevational view of the thin metallic sheet blank as shown in FIG. 6A.
Figure 7A:
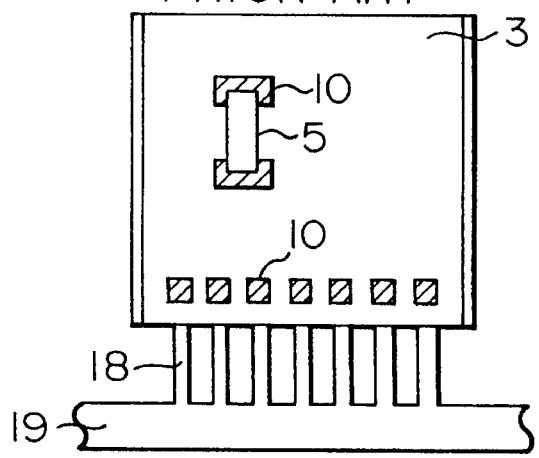
FIG. 7A is a plan view of the thin metallic sheet blank in a step of the production process in which a circuit board is placed on the thin metallic sheet blank.
Figure 7B:
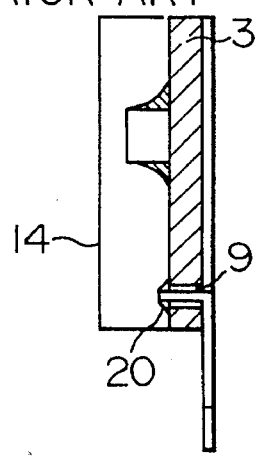
FIG. 7B is a side elevational view of the thin metallic sheet blank in the step of production process shown in FIG. 7A.
Figure 8A:
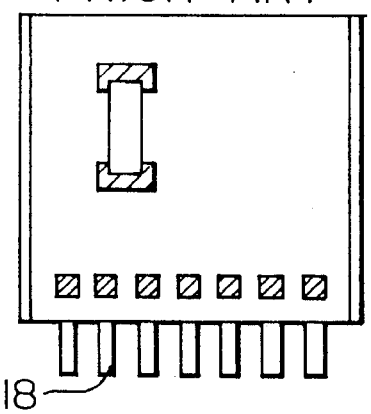
FIG. 8A is a sectional view of the thin metallic sheet blank in a step of the production step in which the lead portions have been severed from the thin metallic sheet blank.
Figure 8B:
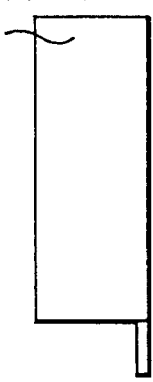
FIG. 8B is a side elevational view of the thin metallic sheet blank in the step of the production process shown in FIG. 8A.

Referring to FIG. 1 showing an embodiment of the circuit module in accordance with the present invention, a shield case 1 and a shield plate 2 are made of thin sheets of a metal such as iron or its alloy or copper or its alloy having a thickness of 0.1 to 0.5 mm, plated as required with tin or solder. The shield case 1 and the shield plate 2 are formed by effecting on these sheet blanks various operations such as cutting, bending and pressing. The shield case 1 and the shield plate 2 are joined together by caulking, fitting, soldering or welding. Numeral 3 denotes a circuit board placed on the shield plate 2. Holes 9 for inserting the ends 20 of terminals thereinto are formed in the circuit board 3 by, for example, drilling or pressing. External leads 4 have ends which are received in these holes 9 and which are connected to conductors 10 provided on the circuit board 3 by soldering as at 6. Numeral 21 designates a pedestal formed on the shield plate 2. An internal shield 22 also is formed on the shield plate 2. Terminal ends 20 of terminals are formed on suitable portions of the internal shield 22 and also on pedestals 21 and shield plate 2, as best shown in FIGS. 1 and 2B. Terminal ends 20 also extend from leads 4 as shown in FIG. 1. The ends 20 of the terminals are received in the holes 9 formed in the circuit board 3 and are connected to the conductors 10 on the circuit board 3 by, for example, soldering as at 6. Circuit components 5, 5 are mounted on both sides of the circuit board 3. These components 5, 5 have terminals 7 which are connected to the conductors 10 on the circuit board 3 by soldering as at 6.

FIGS. 2A and 2B illustrate a step of a process for producing the circuit module shown in FIG. 1. Referring to FIG. 2A, numeral 12 denotes an elongated thin metal sheet blank, portions of which have been removed by press or by etching. The thin metal sheet blank 12 has a main portion 13 which is to form the shield plate 2 shown in FIG. 1. Pedestals 21 and an internal shield 22 are formed on suitable portions of the main portion 13. Ends 20 of terminals are provided on the pedestals 21 and the internal shield 22. The pedestals 21 and the internal shield 22 have been bent substantially at a right angle. Side wall parts 14, 15, which are to form both side walls, are formed on both ends of the main portion 13. Slots 16 are formed in the regions which interconnect the side wall parts 14, 15 to the main portion 13. Lead portions 18 which are to form the external leads 4 in the final product project from a common base portion 19. The outermost lead portions 18, 18 are connected to the above-mentioned main portion 13. The ends 20 of the lead portions 18 are bent substantially at a right angle. Then, the circuit board 3 is placed on the main portion 13 of the thin metal sheet blank 12 as shown in FIG. 3A. A circuit component 5 has been already mounted on the side of the circuit board 3 adjacent the shield plate of the circuit board 3, by an ordinary soldering technique such as re-flow soldering, dipping or manual soldering, when the circuit board 3 is mounted in a manner shown in FIG. 3A. When the circuit board 3 is mounted, the tip ends 20 of the lead portions 18, as well as ends 20 of terminals on the pedestals 21 and the internal shield 22, are inserted into the holes 9 formed in the circuit board 3. Then, electrical connection is achieved by soldering between the circuit component 5 and the conductors 10 on the circuit board 3, as well as between the conductors 10 on the circuit board 3 and the lead portions 18, pedestals 21 and the internal shield 22. The soldering may be conducted by applying a solder paste to all portions to be soldered and the solder paste is fused by, for example, re-flow heating, so that all these portions are soldered at the same time. The side frames 14, 15 are then raised by bending. The bending can be carried out without difficulty by virtue of the provision of the slits 16. Then, the common base 19 is severed from the lead portions 18, and the whole structure is covered by a shield case 1, whereby the circuit module shown in FIG. 1 is completed.

As will be understood from the foregoing description, in the circuit module embodying the present invention, a clearance is formed between the shield plate 2 and the circuit board 3, by virtue of the provision of the pedestals 21 or the internal shield 22 on the shield plate 2 and on the terminals 20 which are formed on one end of the external leads 4. It is therefore possible to mount a circuit component 5 not only on the upper side but also on the lower side of the circuit board 3, thus attaining a higher packaging density, without necessitating the use of circuit components of reduced sizes. Consequently, increased production cost is avoided because circuit components of ordinary sizes can be used in the circuit module. Furthermore, the use of the double-sided circuit board offers increased wiring capacity so as to eliminate the necessity of refining of the wiring patterns, thus allowing ordinary wiring patterns. In addition, the requirement for locating precision for mounting the circuit components 5 is less severe, because a greater total area is available for mounting these circuit components. This allows the use of an ordinary mounting apparatus and, therefore, contributes to reduction in the number of steps of the mounting process and, hence, to reduction in the production cost. Furthermore, difficulties such as standing of chips and bridging of soldered parts are avoided to improve the yield of soldering.

It is also to be noted that the interference between circuits can be suppressed by virtue of the fact that a large distance can be preserved between the circuits because the circuit components 5 can be mounted on both sides of the circuit board 3. Furthermore, higher shielding effect can be obtained so as to improve and stabilize the performance of the circuit module, because the internal shield 22 provided on the lower shield plate 2 is directly connected to the grounding line on the circuit board 3.

Although the described embodiment employs only one internal shield 22, the invention does not exclude the use of a plurality of such internal shields. The use of plural internal shields further improves the shielding effect. In the illustrated embodiment, the pedestal carries terminals. It is to be understood, however, that one or more of a plurality of pedestals may be devoid of terminals, without impairing the performance of the circuit module.

As will be understood from the foregoing description, in the embodiment of the present invention, a circuit board is placed on one side of a shield plate made of a thin metallic sheet, and terminals with pedestals or internal shields formed on the shield plate are received in holes formed in the circuit board for connection to conductors on the circuit board, whereby a space is formed between the shield plate and the circuit board. This arrangement offers the following advantages.

The space formed between the shield plate and the circuit board makes it possible to mount the circuit components also on the lower side of the circuit board, so that the packaging density can be enhanced without being accompanied by any increase in the cost which would otherwise be caused due to the necessity for the use of circuit components of reduced sizes and increased number of steps in the assembly process. Furthermore, the shielding effect is enhanced to improve and stabilize the performance of the circuit module, by virtue of the provision of the internal shield which is provided on the lower shield plate and which is connected to the grounding line on the circuit board.

What is claimed is:

1. A method of producing a high-density circuit module, comprising the steps of:

(a) preparing a single flat metal sheet blank having thin metallic parts which are to form side walls, a shield plate having terminals formed thereon and external leads of said circuit module, said thin metallic parts being connected to the shield plate at connecting portions in positional relationships necessary for assembly of said module;

(b) placing a circuit board on one side of said shield plate of said flat metal sheet blank;

(c) forming holes in said circuit board;

(d) inserting said terminals formed on said shield plate into said holes formed in said circuit board; and (e) performing operations including severing or bending selected ones of said connecting portions at which said thin metallic parts are connected to the shield plate, and effecting required processing on portions to be jointed, wherein:

at least one of said terminals inserted into said holes in said circuit board and formed on said shield plate is provided with a pedestal which supports said circuit board to provide a clearance between said shield plate and said circuit board to enable a circuit component to be mounted on said circuit board between said circuit board and said shield plate.

2. A method of producing a high-density circuit module according to claim 1, further comprising coupling a shield case to said shield plate and wherein step (b) includes placing said circuit board on one side of said shield plate, whereby said circuit board is shielded by said shield plate and said shield case.

3. A method of producing a high-density circuit module according to claim 1, wherein at least one of said terminals inserted into said holes in said circuit board and formed on said shield plate is provided with an internal shield which cooperates with said pedestal to provide said clearance between said shield plate and said circuit board to enable a circuit component to be mounted on said circuit board between said circuit board and said shield plate.

4. A method of producing a high-density circuit module, comprising the steps of:

(a) preparing a single flat metal sheet blank having thin metallic parts which are to form side walls, a shield plate having terminals formed thereon and external leads of said circuit module, said thin metallic parts being connected to the shield plate at connecting portions in positional relationships necessary for assembly of said module;

(b) placing a circuit board on one side of said shield plate of said flat metal sheet blank;

(c) forming holes in said circuit board;

(d) inserting said terminals formed on said shield plate into said holes formed in said circuit board; and (e) performing operations including severing or bending selected ones of said connecting portions at which said thin metallic parts are connected to the shield plate, and effecting required processing or portions to be jointed, wherein:

at least one of said terminals inserted into said holes in said circuit board and formed on said shield plate is provided with an internal shield which supports said circuit board to provide a clearance between said shield plate and said circuit board to enable a circuit component to be mounted on said circuit board between said circuit board and said shield plate.

5. A method of producing a high-density circuit module according to claim 4, further comprising coupling a shield case to said shield plate and wherein step (b) includes placing said circuit board on one side of said shield plate, whereby said circuit board is shielded by said shield plate and said shield case.

6. A high-density circuit module, comprising:

a single flat metal sheet blank having thin metallic parts which are to form side walls, a shield plate having terminals formed thereon and external leads of said circuit module, said thin metallic parts being connected to the shield plate at connecting portions in positional relationships necessary for assembly of said module; and a circuit board placed on one side of said shield plate of said flat metal sheet blank and having holes formed therein; wherein:

said terminals of said shield plate are received in said holes formed in said circuit board;

said terminals of said shield plate are connected to conductors or said circuit board;

at least some of said thin metallic parts are bent relative to said shield plate at said connecting portions and others of said thin metallic parts have portions adapted to be severed from said sheet blank after assembly of said module; and at least one of said terminals inserted into said holes in said circuit board and formed on said shield plate is provided with a pedestal which supports said circuit board to provide a clearance between said shield plate and said circuit board to enable a circuit component to be mounted on said circuit board between said circuit board and said shield plate.

7. A high-density circuit module as in claim 6, wherein at least one of said terminals inserted into said holes in said circuit board and formed on said shield plate is provided with an internal shield which cooperates with said pedestal to provide said clearance between said shield plate and said circuit board to enable a circuit component to be mounted on said circuit board between said circuit board and said shield plate.

8. A high-density circuit module, comprising:

a single flat metal sheet blank having thin metallic parts which aide to form side walls, a shield plate having terminals to formed thereon and external leads of said circuit module, said thin metallic parts being connected to the shield plate at connecting portions in positional relationships necessary for assembly of said module; and a circuit board placed on one side of said shield plate of said flat metal sheet blank and having holes formed therein; wherein:

said terminals of said shield plate are received in said holes formed in said circuit board;

said terminals of said shield plate are connected to conductors on said circuit board;

at least some of said thin metallic parts are bent relative to said shield plate at said connecting portions and others of said thin metallic parts have portions adapted to be severed from said sheet blank after assembly of said module; and at least one of said terminals inserted into said holes in said circuit board and formed on said shield plate is provided with an internal shield which supports said circuit board to provide a clearance between said shield plate and said circuit board to enable a circuit component to be mounted on said circuit board between said circuit board and said shield plate.

* * * * *